(12) United States Patent
Kronholz et al.

(10) Patent No.: US 8,703,551 B2
(45) Date of Patent: Apr. 22, 2014

(54) PROCESS FLOW TO REDUCE HOLE DEFECTS IN P-ACTIVE REGIONS AND TO REDUCE ACROSS-WAFER THRESHOLD VOLTAGE SCATTER

(75) Inventors: Stephan Kronholz, Dresden (DE); Andreas Ott, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 127 days.

(21) Appl. No.: 13/102,680

(22) Filed: May 6, 2011

(65) Prior Publication Data

US 2012/0282763 A1    Nov. 8, 2012

(51) Int. Cl.
*H01L 21/00* (2006.01)
*H01L 21/84* (2006.01)
*H01L 21/8228* (2006.01)
*H01L 21/8238* (2006.01)
*H01L 21/20* (2006.01)
*H01L 21/36* (2006.01)
*H01L 21/302* (2006.01)

(52) U.S. Cl.
USPC .... 438/154; 438/199; 438/492; 257/E21.214; 257/E21.483

(58) Field of Classification Search
USPC ........................ 438/492, 154, 199, 736–738; 257/E21.214–E21.224, 257/E21.483–E21.486, E21.611
See application file for complete search history.

(56) References Cited

U.S. PATENT DOCUMENTS

| | | | |
|---|---|---|---|
| 6,793,835 B2 * | 9/2004 | Luo et al. .......................... 216/79 |
| 2007/0128840 A1 * | 6/2007 | Chen et al. ...................... 438/493 |
| 2009/0181507 A1 * | 7/2009 | Chudzik et al. ............... 438/275 |
| 2009/0294801 A1 * | 12/2009 | Harley et al. .................. 257/192 |
| 2010/0144105 A1 * | 6/2010 | Waite et al. .................... 438/216 |
| 2010/0289094 A1 | 11/2010 | Reichel et al. |

\* cited by examiner

*Primary Examiner* — Calvin Choi
(74) *Attorney, Agent, or Firm* — Amerson Law Firm, PLLC

(57) ABSTRACT

Disclosed herein is a method of forming a semiconductor device. In one example, the method comprises performing at least one etching process to reduce a thickness of a P-active region of a semiconducting substrate to thereby define a recessed P-active region, performing a process in a process chamber to selectively form an as-deposited layer of a semiconductor material on the recessed P-active region, wherein the step of performing the at least one etching process is performed outside of the process chamber, and performing an etching process in the process chamber to reduce a thickness of the as-deposited layer of semiconductor material.

14 Claims, 3 Drawing Sheets

US 8,703,551 B2

PROCESS FLOW TO REDUCE HOLE DEFECTS IN P-ACTIVE REGIONS AND TO REDUCE ACROSS-WAFER THRESHOLD VOLTAGE SCATTER

BACKGROUND OF THE INVENTION

1. Field of the Invention

Generally, the present disclosure generally relates to the manufacturing of sophisticated semiconductor devices, and, more specifically, to a process flow that may reduce hole defects in P-active regions and reduce across-wafer threshold voltage scatter.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors (NFETs) and/or P-channel transistors (PFETs), are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer. For example, a channel length of approximately 0.08 µm may require a gate dielectric made of silicon dioxide as thin as approximately 1.2 nm. Although, generally, usage of high speed transistor elements having an extremely short channel may be restricted to high-speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may no longer be compatible with requirements for many types of integrated circuits.

Therefore, replacing silicon dioxide, or at least a part thereof, as the material for gate insulation layers has been considered. Possible alternative dielectrics include so-called high-k materials (k value greater than 10) that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials, such as tantalum oxide ($Ta_2O_5$) with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architecture based on high-k dielectrics, additionally, transistor performance may also be increased by providing an appropriate conductive material for the gate electrode to replace the typical polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon material, such as titanium nitride and the like, may be formed so as to directly connect to the high-k dielectric material, thereby substantially avoiding the presence of a depletion zone. Therefore, the threshold voltage of the transistors is significantly affected by the work function of the gate material that is in contact with the gate dielectric material, and an appropriate adjustment of the effective work function with respect to the conductivity type of the transistor under consideration has to be guaranteed.

For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. For this reason, it has also been proposed to appropriately adjust the threshold voltage of transistor devices by providing a specifically designed semiconductor material at the interface between the high-k dielectric material and the channel region of the transistor device, in order to appropriately "adapt" the band gap of the specifically designed semiconductor material to the work function of the metal-containing gate electrode material, thereby obtaining the desired low threshold voltage of the transistor under consideration. Typically, a corresponding specifically designed semiconductor material, such as silicon/germanium and the like, may be provided by an epitaxial growth technique at an early manufacturing stage, which may also present an additional complex process step, which, however, may avoid complex processes in an advanced stage for adjusting the work function and, thus, the threshold voltages in a very advanced process stage.

It turns out, however, that the manufacturing sequence of forming the threshold adjusting semiconductor alloy may have a significant influence on threshold variability and other transistor characteristics, as will be described in more detail with reference to FIG. 1.

FIG. 1 depicts an illustrative prior art device 100 that is generally comprised of a partially formed NFET transistor 100N and a partially formed PFET transistor 100P formed in and above a semiconducting substrate 10. The illustrative transistors 100N, 100p are separated by an illustrative isolation structure 12, e.g., a shallow trench isolation structure, formed in the substrate 10. In one illustrative embodiment, the semiconducting substrate 10 is comprised of silicon. The substrate 10 may have a variety of configurations, such the depicted silicon-on-insulator (SOI) structure having a bulk silicon layer 10A, a buried insulation layer 10B and an active layer 10C. The substrate 10 may also have a simple bulk silicon configuration.

At the stage of manufacture depicted in FIG. 1, the transistors 100N, 100P are each comprised of a gate structure 20 and source/drain regions 30. The gate structure 20 may include a gate insulation layer 22, a high-k insulation layer 24, a gate electrode 26 and sidewall spacers 28. The gate electrode may be made of a variety of materials, such as aluminum (for the NFET transistor 100N) and lanthanum (for the PFET transistor 100P). In some cases, the PFET transistor 100P may have an additional work function layer 25, such as titanium nitride, that may not be present in the NFET transistor 100N. Typically, during the formation of the PFET transistor 100P, a layer of semiconductor material 32, e.g., silicon germanium, is selectively formed on the active layer 10C in the P-active region where the PFET transistor 100P will be formed to enhance the performance of the PFET transistor 100P. Typically, such a semiconductor layer is not formed for the NFET transistor 100N. Prior to selectively forming the layer of semiconductor material 32 for the PFET transistors 100P, one or more etching and masking process may be performed such that only the portions of the active layer 10C where PFET transistors 100P will be formed are exposes to the selective deposition process, e.g., a selective epitaxial deposition process. As a result of these various etching and masking steps, the thickness of portions of the isolation region 12 adjacent the P-active regions of the active layer 10C may be reduced as compared to the thickness of the portions of the isolation region adjunct the N-active regions of the active layer 10C. Additionally, although not depicted in FIG. 1, the layer of material that make gate electrode structure may not be the same for the PFET and NFET transistors, 100P, 100N, respectively. That is, in one example, the PFET transistor 100P may have additional work function adjusting materials as compared to the materials used for the NFET transistor 100N. The thickness of the layers of materials may vary as well for the NFET and PFET transistors 100N, 100P, even if the same material is employed.

One of more of the forgoing issues tends to make the total height of the NFET and PFET transistors 100N, 100P, different, and this height differential tends to exist across a wafer. In addition to making subsequent processing operation, like chemical mechanical polishing, more problematic, such across- wafer height differences can lead to relatively large variations in the threshold voltage of the resulting devices, thereby making control of the various devices difficult, at best. Additionally, such height differences may tend to make critical gate patterning operations less accurate as across-wafer height difference tends to make photolithography operations less accurate. Given that the gate length on modern transistor devices is 30-50 nm, and that further scaling is anticipated in the future, even very small errors in the gate patterning activities can significantly impact the performance of the resulting transistors. From an overall perspective, such threshold voltage variations may also lead to reduced yields and/or decreased performance capabilities of the resulting semiconductor device.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a process flow for manufacturing an integrated circuit device that may reduce hole defects in P-active regions of the device and may reduce variations in the threshold voltages of the transistors in the device. In one example, the method comprises performing at least one etching process to reduce a thickness of a P-active region of a semiconducting substrate to thereby define a recessed P-active region, performing a process in a process chamber to form an as-deposited layer of a semiconductor material on the recessed P-active region, wherein the step of performing the at least one etching process is performed outside of the process chamber that was used in forming the layer of semiconductor material, and performing an etching process in the process chamber to reduce a thickness of the as-deposited layer of semiconductor material.

A further illustrative method disclosed herein comprises performing at least one etching process using at least one of tetra methyl ammonium hydroxide (TMAH) or ammonia ($NH_3$) to reduce a thickness of a P-active region of a semiconducting substrate to thereby form a recessed P-active region, performing an epitaxial deposition process in a process chamber to form an as-deposited layer of a semiconductor material selectively on said recessed P-active region, wherein the step of performing the at least one etching process to form the recessed P-active region is performed outside of the process chamber, and performing an etching process in the process chamber to reduce a thickness of the as-deposited layer of semiconductor material.

BRIEF DESCRIPTION OF THE DRAWINGS

The disclosure may be understood by reference to the following description taken in conjunction with the accompanying drawings, in which like reference numerals identify like elements, and in which.

Figure 1:
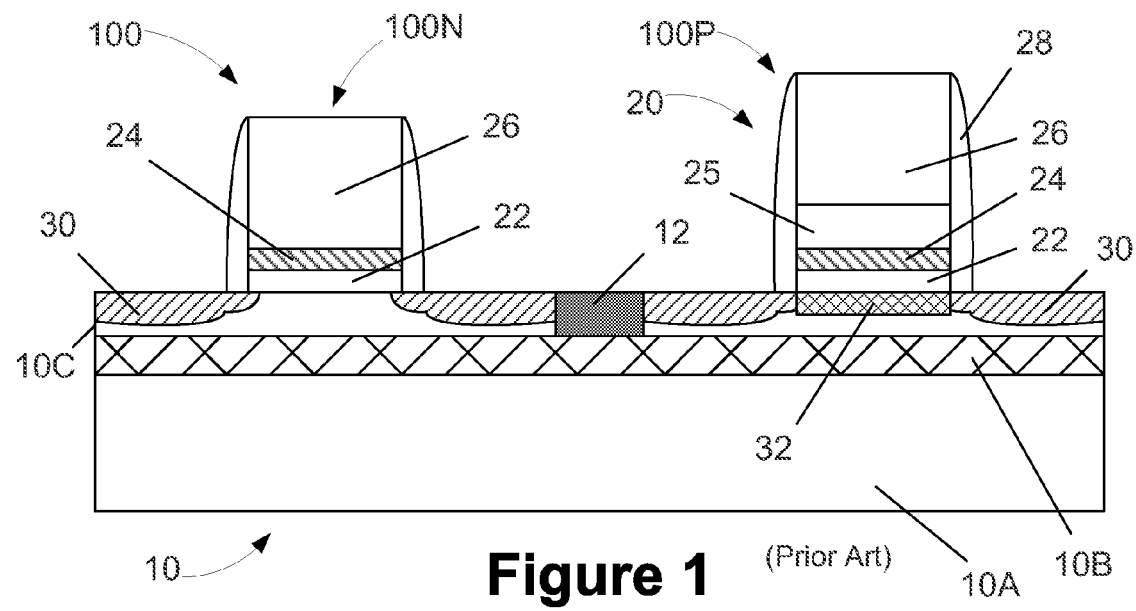
FIG. 1 schematically depicts an illustrative prior art semiconductor device that includes illustrative NFET and PFET transistors.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides is directed to techniques that may be employed in forming sophisticated gate electrode structures for various integrated circuit devices while reducing or perhaps eliminating across-wafer height differences between NFET and PFET transistors. The illustrative process flow described herein may also reduce variations in the threshold voltages of the NFET and PFET transistors. In some cases, the transistors may include a high-k dielectric material (k value greater than 10) and a metal-containing electrode material. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, resistors, conductive lines, etc. With reference to FIGS. 2a-2i, further illustrative embodiments will now be described in more detail, wherein reference may also be made to FIG. 1, if required.

Figure 2A:
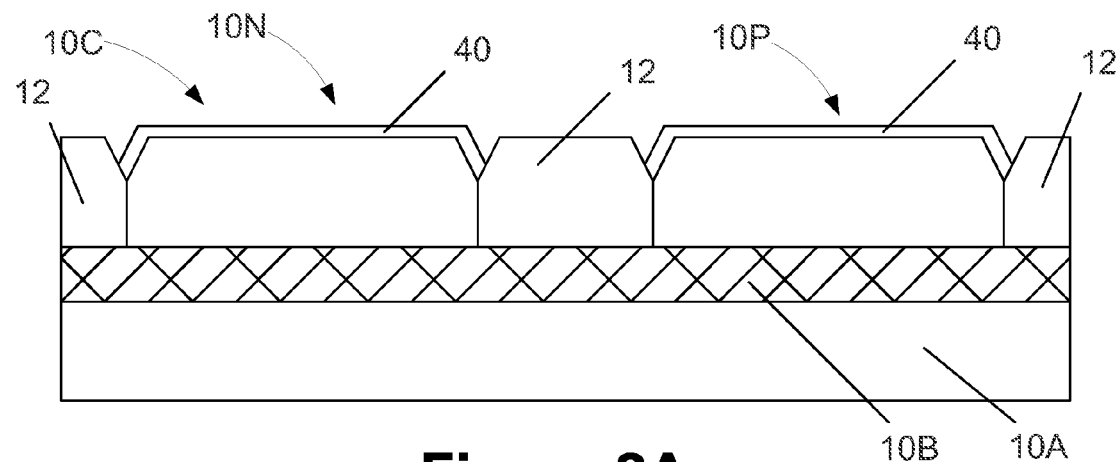
FIGS. 2A-2F depict one illustrative example of the novel process flow described herein.

FIG. 2A depicts an illustrative device 100 that is generally comprised of an N-active region 10N, where an illustrative NFET transistor will ultimately be formed, and a P-active region 10P, where an illustrative PFET transistor will ultimately be formed. The NFET and PFET transistors will be formed in and above the active layer 10C of the semiconducting substrate 10. The illustrative active regions 10N, 10P are separated by an illustrative isolation structure 12, e.g., a shallow trench isolation structure, formed in the substrate 10. In one illustrative embodiment, the semiconducting substrate 10 a silicon-on-insulator (SOI) substrate comprised of bulk silicon 10A, a buried insulation layer 10B (commonly referred to as a "BOX" layer 10B and an active layer 10C, which may also be a silicon material. Of course, the present invention is equally applicable to other configurations of the substrate 10. For example, the substrate 10 may be comprised of semiconducting materials other than silicon and/or it may be in another form, such as a bulk silicon configuration. Thus, the terms substrate or semiconductor substrate should be understood to cover all semiconductor structures.

At the stage of manufacture depicted in FIG. 2A, the N-active region 10N and the P-active region 10P have been defined by the formation of illustrative shallow trench isolation structures 12 in the active layer 10C of the substrate 10. The substrate 10 itself, and the isolation structures 12 may be formed using traditional techniques. For example, the isolation structures 12 may be formed by performing one or more etching and deposition processes, which are well known to those skilled in the art. Also depicted in FIG. 2A is an illustrative pad oxide layer 40 (also sometimes referred to as a "screen oxide") formed on the active regions 10N, 10P. The pad oxide layer 40 may be comprised of a variety of materials, e.g., silicon dioxide, etc., and it may be formed by a variety of techniques, e.g., chemical vapor deposition (CVD), low pressure chemical vapor deposition (LPCVD), thermal growth, etc. In one illustrative embodiment, the pad oxide layer 16 is comprised of a thermally grown layer of silicon dioxide having a thickness ranging from approximately 1-2 nm.

Figure 2B:
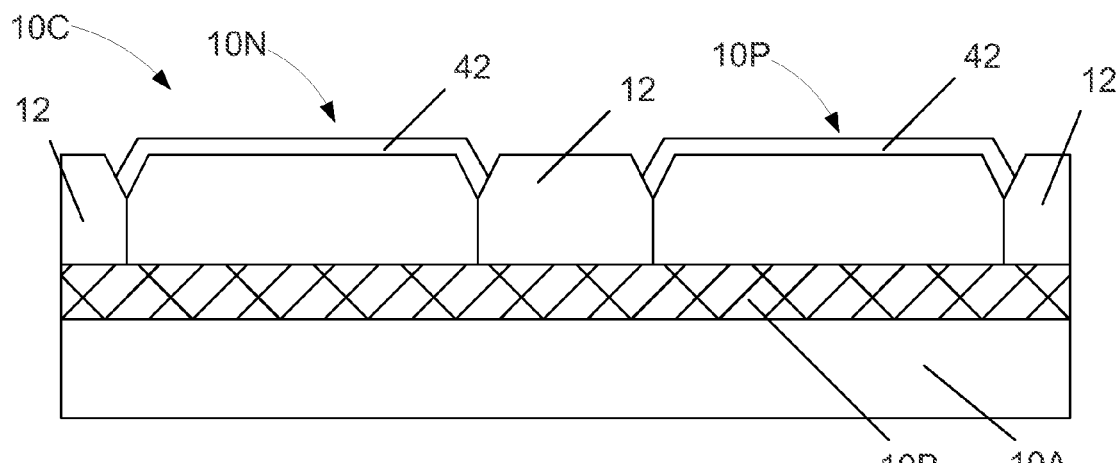

Next, as shown in FIG. 2B, a hard mask layer 42 is formed above the pad oxide layer 40. Depending upon the material of the hard mask layer 42, and the manner it which it is formed, the hard mask layer 42 may effectively combine with the pad oxide layer 40. The hard mask layer 40 may be comprised of a variety of materials, e.g., silicon dioxide, silicon nitride, etc., and it may be formed by a variety of techniques, e.g., chemical vapor deposition (CVD), low pressure chemical vapor deposition (LPCVD), thermal growth, etc. In one illustrative embodiment, the hard mask layer 16 is comprised of a thermally grown layer of silicon dioxide having a thickness ranging from approximately 8-9 nm. In this illustrative embodiment, where both the pad oxide layer 40 and the hard mask layer 42 are made of silicon dioxide, the depicted layer 42 is actually a combination of those two layers. In that illustrative example, as compared to the stage of manufacture depicted in FIG. 2A, the amount of silicon dioxide material above the active regions 10N, 10P has effectively been increased or thickened.

Figure 2C:
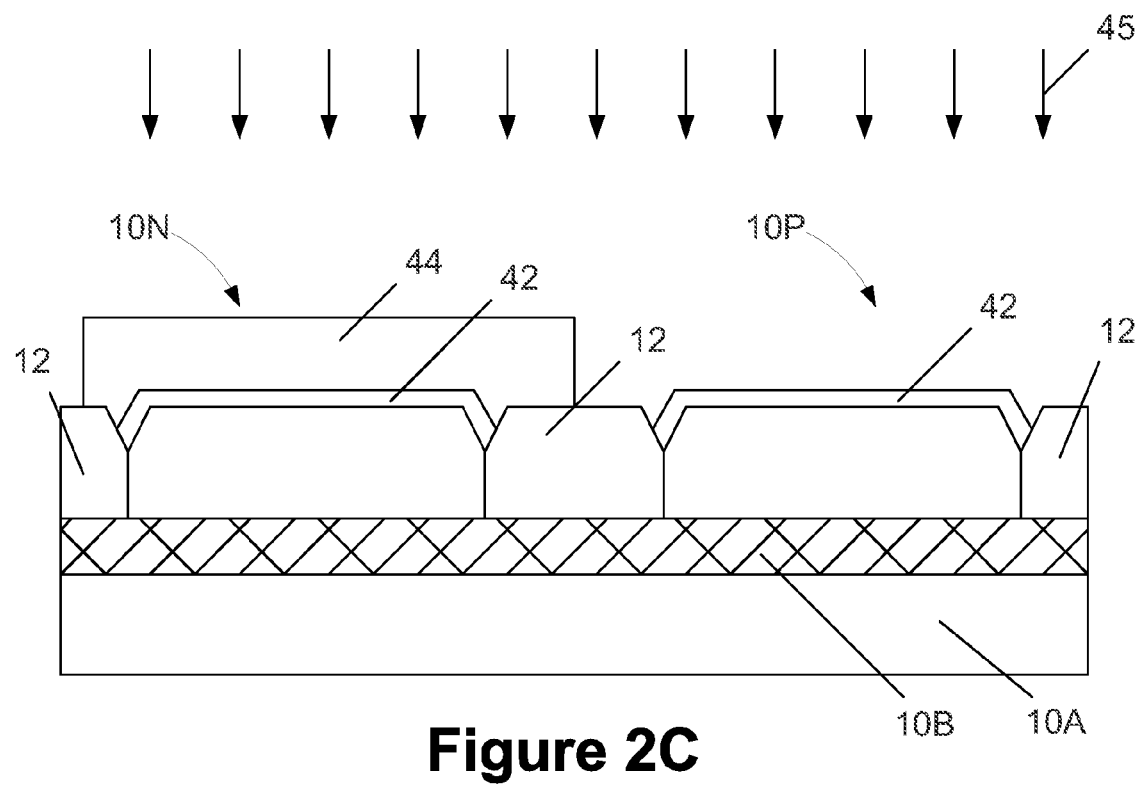
Figure 2D:
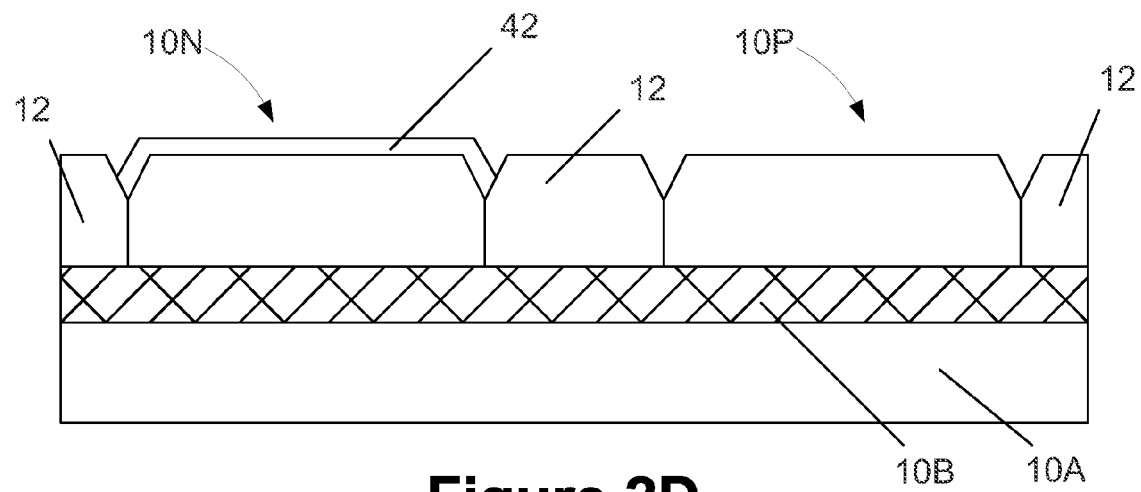

Next, as shown in FIG. 2C, a masking layer 44 is formed over the N-active regions 10N across the substrate 10. The masking layer 44 may be comprised of a variety of materials, e.g., photoresist, a material selectively etchable with respect to silicon and the material of the hard mask layer 42. The masking layer 44 may be formed by a variety of techniques, e.g., spin-coating, chemical vapor deposition (CVD), low pressure chemical vapor deposition (LPCVD), etc. In one illustrative embodiment, the masking layer 44 is a layer of photoresist that is formed using traditional photolithography techniques, e.g., spin-on coating, soft-bake, exposure, hard bake and develop, etc.

A schematically depicted etching process 45 is performed on the device depicted in FIG. 2C to reduce the thickness of the hard mask layer 42 in the exposed P-active regions 10P across the substrate 10. After the etching process 45 is performed, the masking layer 44 may be removed using traditional techniques to result in the device depicted in FIG. 2D. The etching process 45 effectively exposes the surface of the P-active region 10P. The type of etching process 45 performed may vary depending upon a variety of factors such as the material of the hard mask layer 42 and the nature of the device under construction. In one illustrative embodiment, where the hard mask layer 42 is a layer of silicon dioxide, the etching process 45 may be a wet HF acid etching process. After the etching process 45 is performed that masking layer 44 may be remove by, for example, performing a wet photoresist stripping process.

Figure 2E:
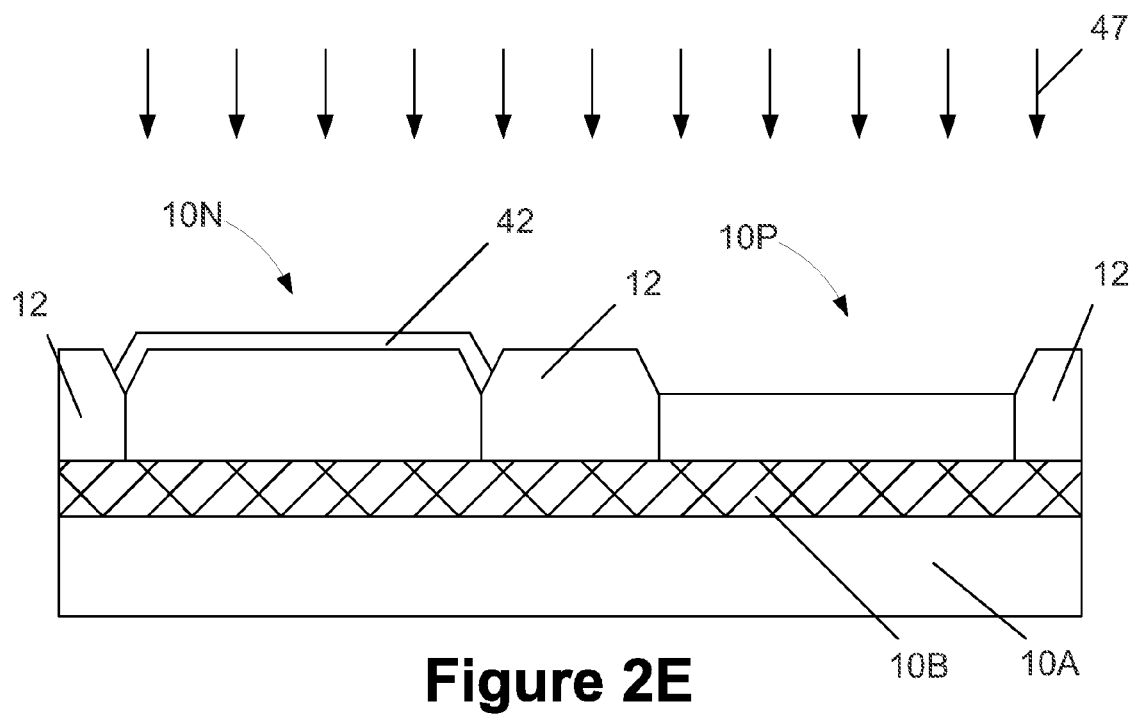

Next, as shown in FIG. 2E, and etching process 47 is performed to recess or reduce the thickness of the P-active region 10P. Ultimately, as describe more fully below, a layer of semiconductor material, e.g., silicon germanium (SiGe) will be formed above the recessed P-active region 10P. The type of etching process 47 performed, e.g., wet or dry, the etchant(s) used, and the parameters of the etching process 47 may vary depending upon a variety of factors such as the material of the P-active region 10P and the nature of the device under construction. In one illustrative embodiment, where the P-active region 10P is silicon dioxide, the etching process 47 may be a wet etching process wherein an aqueous solution of (1) tetra methyl ammonium hydroxide (TMAH), (2) ammonia ($NH_3$), or (3) other quartenary ammonia hydoroxide derivative (Tetraethylammoniahydroxide, tetrapropyleammoniahydroxide, tetrabutylammoniahydroxide, etc), or mixtures of (1), (2) and/or (3), wherein the etching process 47 is performed at suitable concentration, temperature and time to reduce the thickness of the P-active region 10P to the final desired thickness. The etching process 47 may also involve use of liquids having a PH greater than 8 that contain amines wherein the etching process is again performed at appropriated concentrations, times and temperatures for the particular application. In some cases, the etching solution used in the etching process 47 may also contain oxidizing agents. For example, the etchant may be a combination of ammonia and hydrogen peroxide (so-called "SC1"), or an ammonia-peroxide mixture ("APM") or by adding oxidizing agents like, for example, hydrogen peroxide and/or ozone, to other acids. In one illustrative example, the etching process 47 may be performed at a temperature of approximately 0-50 C, or more specifically 20-40 C, for a duration of approximately 30 seconds to a few minutes, e.g., 4 minutes. In one example, the source of the hydroxide may comprise between about 2 and about 30 percent ammonium hydroxide or a tetraalkykl ammonium hydroxide, e.g., tetramethyl ammonium hydroxide, by volume in deionized water. In other examples, the concentration of TMAH may range from approximately 5-25%. If ammonia is employed the concentration may range from approximately 5-32%. Both blends may contain $H_2O_2$ (1:1 to 2:1 the source of hydroxide), although this may vary especially with highly concentrated caustics.

Figure 2F:
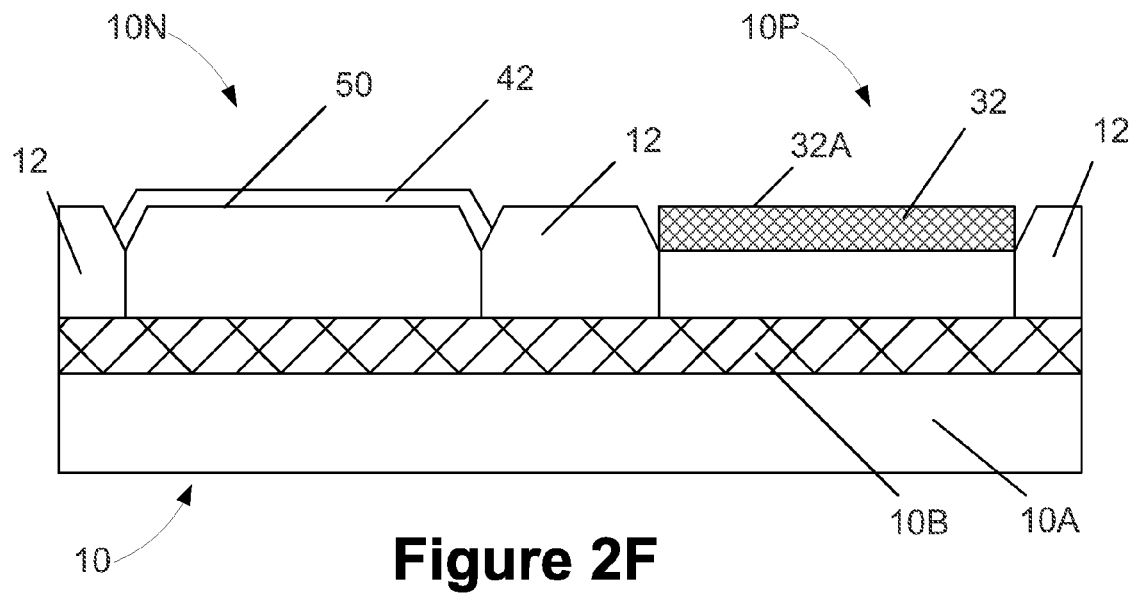

Next, as shown in FIG. 2F a layer of semiconductor material 32 is formed on the recessed P-active region 10P. Prior to forming the semiconductor material 32, a pre-clean process may be performed to remove materials such as native oxides from the surface of the recessed P-active region 10P. The pre-clean process may be performed using, for example, a HF in either a wet or dry etching process. As part of the pre-clean process, the thickness of the hard mask layer 42 above the N-active region 10N may be reduced to a thickness of approximately 2-4 nm.

The layer of semiconductor material 32 may be made from a variety of semiconductor materials, e.g., silicon, silicon germanium, etc., or combinations thereof, and it may be formed by a variety of techniques, e.g., by performing an epitaxial growth process in an deposition chamber, etc. In one illustrative embodiment, the layer of semiconductor material 32 is a layer of silicon germanium that is selectively deposited on the exposed surfaces of the recessed P-active region 10P in an epi deposition reactor chamber. In one particularly illustrative example, where the layer of semiconductor material 32 is silicon-germanium, it may have an as-deposited thickness of approximately 3-20 nm, and it may have germanium concentration ranging from approximately 20-40% germanium.

In one process flow, the etching process 45 performed to recess the P-Active region 10P is performed in some process chamber or tank that is different from the chamber used to form the layer of semiconductor material 32. It is believed that, when employing certain acids to recess the P-active region 10P, such as hydrochloric acid (HCl), the presence of residual metal contaminants tends to increase the etching rate of the HCl etching process. As a result, given the relative thin active layer 10C found in modern semiconductor devices, such an "over-active" or "enhanced" etching process would tend to remove all or significant portions of the P-active region 10P to the point where all or some of the underlying buried insulation layer 10B is exposed. In effect, this would leave "holes" in the P-active region 10P where the etching process 45 exposes the underlying buried insulation layer 10B to a significant degree or completely. Of course, if there is little or none of the P-active region 10P remaining for a particular PFET transistor, then a layer of epitaxial silicon cannot be grown in such a location. The net result is that the use of HCl to recess the P-active region 10P may, in some cases, result in PFET devices that simply do not work. The presently disclosed subject matter tends to correct or at least reduce this problem by, in one embodiment, selecting the appropriate etchants, e.g., TMAH or $NH_3$, and performing the etching process in a process vessel that is different from the epi reactor used to form layer of semiconductor material 32 in an effort to avoid performing the etching process in an environment that is likely to contain metal contaminants.

Ultimately, the objective is to have the upper surface 32A of the layer of semiconductor material 32 be approximately the same height as the upper surface 50 of the N-active region 10N to reduce across-wafer non-uniformity in the height of the NFET and PFET devices, and thereby reduce the relatively large variations in threshold voltage values the tend to exist when such height variations exist. In one illustrative embodiment, after the semiconductor layer 32 is formed, an etching process using, for example, HCl, may be performed to reduce the thickness of the as-deposited layer of semiconductor material 32 such that the upper surface 32A of layer of semiconductor material 32 is approximately the same height as the upper surface 50 of the N-active region 10N. Alternatively, if there is sufficient control of the process used to form the semiconductor layer 32, then the semiconductor layer 32 may be formed such that the upper surface 50 of the as-deposited layer of semiconductor material 32 is approximately the same height as the upper surface 50 of the N-active region 10N. The final thickness of semiconductor material layer 32 after it is subjected to the etching process 47 will vary depending upon device structure (gate length, Germanium concentration, etc. In one illustrative embodiment, the thickness of the semiconductor material layer 32 after it is subjected to the etching process 47 may range from 6-12 nm.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing at least one etching process to reduce a thickness of a P-active region of a semiconducting substrate to thereby define a recessed P-active region;
    performing a process in a process chamber to form an as-deposited layer of a semiconductor material on said recessed P-active region, wherein said step of performing said at least one etching process to reduce said thickness of said P-active region is performed outside of said process chamber; and
    performing an etching process in said process chamber to reduce a thickness of said as-deposited layer of semiconductor material.

2. The method of claim 1, wherein performing said at least one etching process comprises performing said at least one etching process using at least one of tetra methyl ammonium hydroxide (TMAH) or ammonia (NH$_3$) during said at least one etching process.

3. The method of claim 1, wherein performing said etching process in said process chamber to reduce said thickness of said as-deposited layer of semiconductor material comprises performing said etching process in said process chamber to reduce said thickness of said as-deposited layer of semiconductor material such that an upper surface of said layer of semiconductor material having said reduced thickness is at approximately the same level as an upper surface of a N-active region of said semiconducting substrate.

4. The method of claim 1, wherein performing said process in said process chamber to form said as-deposited layer of said semiconductor material on said recessed P-active region comprises performing a selective epitaxial deposition process in an epi deposition chamber to form said as-deposited layer of said semiconductor material selectively on said recessed P-active region.

5. The method of claim 1, wherein said layer of semiconductor material comprises silicon germanium.

6. The method of claim 4, wherein performing said etching process in said process chamber to reduce a thickness of said as-deposited layer of semiconductor material comprise performing an etching process using hydrochloric acid (HCl) in said epi deposition chamber to reduce said thickness of said as-deposited layer of semiconductor material.

7. A method, comprising:
    performing at least one etching process using at least one of tetra methyl ammonium hydroxide (TMAH) or ammonia (NH$_3$) to reduce a thickness of a P-active region of a semiconducting substrate to thereby form a recessed P-active region;
    performing an epitaxial deposition process in a process chamber to form an as-deposited layer of a semiconductor material selectively on said recessed P-active region, wherein said step of performing said at least one etching process to form said recessed P-active region is performed outside of said process chamber; and
    performing an etching process in said process chamber to reduce a thickness of said as-deposited layer of semiconductor material.

8. The method of claim 7, wherein performing said etching process in said process chamber to reduce said thickness of said as-deposited layer of semiconductor material comprises performing said etching process in said process chamber to reduce said thickness of said as-deposited layer of semiconductor material such that an upper surface of said layer of semiconductor material having said reduced thickness is at approximately the same level as an upper surface of a N-active region of said semiconducting substrate.

9. The method of claim 7, wherein said layer of semiconductor material comprise silicon germanium.

10. The method of claim 7, wherein performing said etching process in said process chamber to reduce a thickness of said as-deposited layer of semiconductor material comprise performing an etching process using hydrochloric acid (HCl) in said epi deposition chamber to reduce said thickness of said as-deposited layer of semiconductor material.

11. A method, comprising:
    performing at least one etching process using at least one of tetra methyl ammonium hydroxide (TMAH) or ammonia (NH$_3$) to reduce a thickness of a P-active region of a semiconducting substrate to thereby form a recessed P-active region;
    performing a selective epitaxial deposition process in a process chamber to form an as-deposited layer of a silicon germanium semiconductor material selectively on said recessed P-active region, wherein said step of performing said at least one etching process to form said recessed P-active region is performed outside of said process chamber; and
    performing an etching process in said process chamber to reduce a thickness of said as-deposited layer of silicon germanium semiconductor material such that an upper surface of said layer of silicon germanium semiconductor material having said reduced thickness is at approximately the same level as an upper surface of a N-active region of said semiconducting substrate.

12. The method of claim 11, wherein performing said etching process in said process chamber to reduce a thickness of said as-deposited layer of silicon germanium semiconductor material comprise performing an etching process using hydrochloric acid (HCl) in said process chamber to reduce said thickness of said as-deposited layer of silicon germanium semiconductor material.

13. The method of claim 11, where said as-deposited thickness of layer of silicon germanium semiconductor material is approximately 3-20 nm.

14. The method of claim 13, wherein after performing said etching process in said process chamber to reduce said thickness of said as-deposited layer of silicon germanium semiconductor material is performed, a final thickness of said layer of silicon germanium semiconductor material is approximately 6-12 nm.

* * * * *